(12) United States Patent
Xiong

(10) Patent No.: US 7,969,176 B2
(45) Date of Patent: Jun. 28, 2011

(54) VOLTAGE MARGIN TEST DEVICE

(75) Inventor: Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 64 days.

(21) Appl. No.: 12/610,359

(22) Filed: Nov. 2, 2009

(65) Prior Publication Data

US 2011/0043188 A1 Feb. 24, 2011

(30) Foreign Application Priority Data

Aug. 18, 2009 (CN) .......................... 2009 1 0305759

(51) Int. Cl.
*G01R 31/40* (2006.01)
(52) U.S. Cl. ................................................. 324/764.01
(58) Field of Classification Search .............. 324/764.01
See application file for complete search history.

(56) References Cited

U.S. PATENT DOCUMENTS

| 7,397,267 B2* | 7/2008 | Wang ..................... 324/750.3 |
| 7,491,931 B2* | 2/2009 | Gabeler ..................... 250/288 |

* cited by examiner

*Primary Examiner* — Ha Tran T Nguyen
*Assistant Examiner* — Tung X Nguyen
(74) *Attorney, Agent, or Firm* — Zhigang Ma

(57) ABSTRACT

A voltage margin test device tests an allowable minimum and an allowable maximum of an electronic device to obtain the voltage margin within which the electronic device can work normally.

10 Claims, 2 Drawing Sheets

VOLTAGE MARGIN TEST DEVICE

BACKGROUND

1. Technical Field

The present disclosure relates to test devices, and particularly to a test device to determine a voltage margin of an electronic device.

2. Description of Related Art

An electronic device, such as a computer motherboard, may work normally at a working voltage. The working voltage may vary between an allowable maximum and an allowable minimum, that is, the voltage may vary within a certain margin. To determine an acceptable voltage margin, testing is normally performed using expensive equipment.

DETAILED DESCRIPTION

Figure 1:
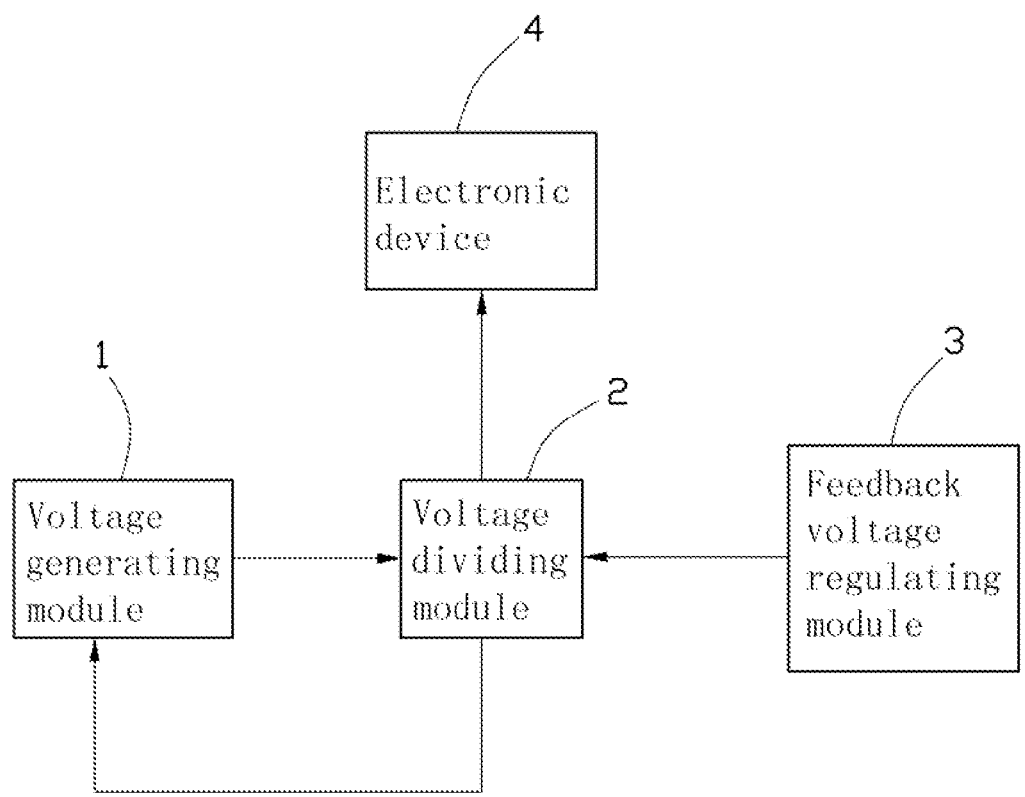
FIG. 1 is a block diagram of an exemplary embodiment of a voltage margin test device, together with an electronic device to be tested.
Figure 2:
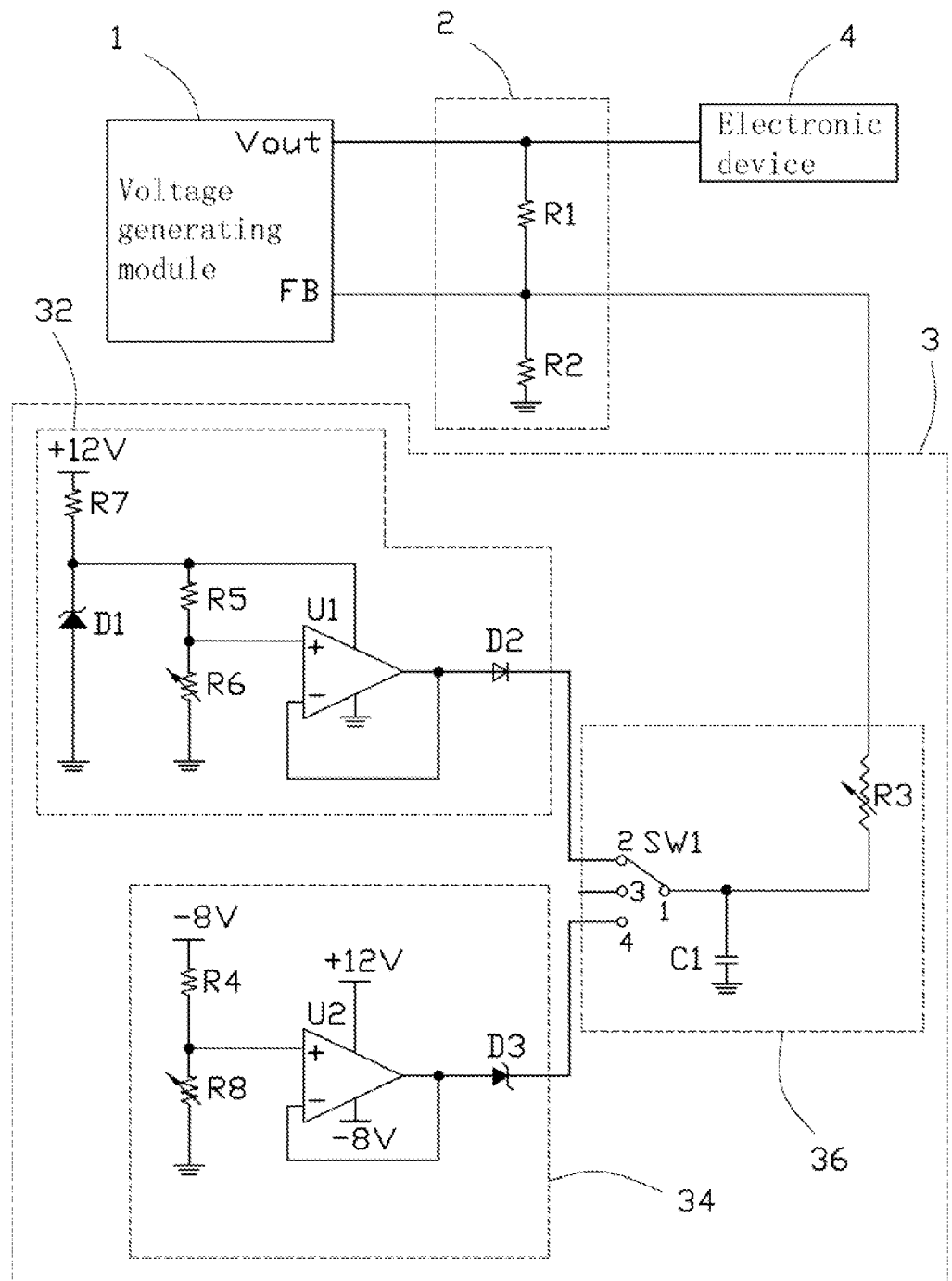
FIG. 2 is a circuit diagram of the voltage margin test device of FIG. 1.

Referring to FIGS. 1 and 2, an exemplary embodiment of a voltage margin test device is used to determine a voltage margin of an electronic device 4, such as a motherboard. The voltage margin test device includes a voltage generating module 1, a voltage dividing module 2 connected to the voltage generating module 1 and the electronic device 4, and a feedback voltage regulating module 3 connected to the voltage dividing module 2.

The voltage generating module 1 includes a voltage output terminal Vout and a feedback voltage input terminal FB. The voltage output terminal Vout outputs a controllably varied working voltage to the electronic device 4 via the voltage dividing module 2. The feedback voltage input terminal FB connects to the voltage dividing module 2 and receives a first regulation voltage or a second regulation voltage from the feedback voltage regulating module 3. The working voltage is adjusted by the first and second regulation voltages. In one embodiment, the voltage generating module 1 may be a pulse width modulation (PWM) chip. And voltage of the voltage output terminal Vout is inversely proportional to voltage of the feedback voltage input terminal FB.

The voltage dividing module 2 includes two resistors R1, R2. A first terminal of the resistor R1 is connected to the voltage output terminal Vout of the voltage generating module 1 and the electronic device 4. A second terminal of the resistor R1 is grounded via the resistor R2, and also connected to the feedback voltage input terminal FB of the voltage generating module 1 and the feedback voltage regulating module 3.

The feedback voltage regulating module 3 includes a first voltage output unit 32, a second voltage output unit 34, and a switch unit 36. The first voltage output unit 32 and the second voltage output unit 34 are connected to the switch unit 36 to respectively provide the first regulation voltage and the second regulation voltage.

The first voltage output unit 32 includes two resistors R5, R7, a sliding rheostat R6, an amplifier U1, a zener diode D1, and a diode D2. A non-inverting terminal of the amplifier U1 is grounded via the sliding rheostat R6, and also connected to a cathode of the zener diode D1 via the resistor R5. An anode of the zener diode D1 is grounded. A power terminal of the amplifier U1 and the cathode of the zener diode D1 are connected to a +12 V power supply via the resistor R7. A ground terminal of the amplifier U1 is grounded. An output terminal and an inverting terminal of the amplifier U1 are connected to an anode of the diode D2. A cathode of the diode D2 is connected to the switch unit 36.

The second voltage output unit 34 includes a resistor R4, a sliding rheostat R8, an amplifier U2, and a zener diode D3. A non-inverting terminal of the amplifier U2 is connected to a −8V power supply via the resistor R4, and also grounded via the sliding rheostat R8. A power terminal of the amplifier U2 is connected to a +12 V power supply.

A ground terminal of the amplifier U2 is grounded. An inverting terminal and an output terminal of the amplifier U2 are connected to an anode of the zener diode D3. A cathode of the zener diode D3 is connected to the switch unit 36.

The switch unit 36 includes a single-pole three-throw switch SW1, a sliding rheostat R3, and a capacitor C1. A pole terminal 1 of the switch SW1 is grounded via the capacitor C1, and also connected to a node between the resistors R1 and R2 via the sliding rheostat R3. A first throw terminal 2 of the switch SW1 is connected to the cathode of the diode D2. A second throw terminal 3 of the switch SW1 is idle. A third throw terminal 4 of the switch SW1 is connected to cathode of the zener diode D3. A maximum resistance of the sliding rheostat R3 is at least ten times greater than resistance of the resistor R2.

Before conducting a test, the pole terminal 1 of the switch SW1 is connected to the second throw terminal 3, the resistance of the sliding rheostat R3 is adjusted to be at least ten times greater than the resistance of resistor R2 for increasing resistance of the feedback voltage regulating module 3.

To determine the allowable minimum working voltage, the pole terminal 1 of the switch SW1 is connected to the first throw terminal 2. The resistance of the sliding rheostat R6 is adjusted to be minimum and then gradually increased. A voltage at the inverting terminal of the amplifier U1 is equal to a voltage at the output terminal of the amplifier U1. The first voltage output unit 32 outputs the first regulation voltage to the node between the resistors R1 and R2 of the voltage dividing module 2 and the feedback voltage input terminal FB of the feedback voltage regulating module 3. The first regulation voltage is positive and increases with the resistance of the sliding rheostat R6 increasing. Because voltage of the voltage output terminal Vout is inversely proportional to voltage of the feedback voltage input terminal FB, voltage of the feedback voltage input terminal FB increases to make voltage of the voltage output terminal Vout decrease. The working voltage is decreased gradually until the electronic device 4 cannot work, thus determining a minimum working voltage. A meter (not shown) can be used to measure the current working voltage to determine the allowable minimum of the working voltage. In this embodiment, the maximum resistance of the sliding rheostat R3 is at least ten times greater than the resistance of the resistor R2, and the voltage at the node between the resistors R1 and R2 of the voltage dividing module 2 is far greater than the first regulation voltage, the diode D2 is capable of preventing the voltage at the node between the resistors R1 and R2 from burning the amplifier U1. The capacitor C1 can act as a filter or a buffer for stabilizing the first regulation voltage. The zener diode D1 keeps a voltage at a node between the resistors R5 and R7 stable.

To determine the allowable maximum working voltage, the pole terminal 1 of the switch SW1 is connected to the third terminal 4, the resistance of the sliding rheostat R8 is adjusted to be minimum, and then gradually increased. Voltage of the inverting terminal of the amplifier U2 is equal to voltage of the output terminal of the amplifier U2. The second voltage output unit 34 outputs the second regulation voltage to the node between the resistors R1 and R2 of voltage dividing module 2 and the feedback voltage input terminal FB of the feedback voltage regulating module 3. The second regulation voltage is negative and decreases with the resistance of the sliding rheostat R8 increasing. Because voltage of the voltage output terminal Vout is inversely proportional to voltage of the feedback voltage input terminal FB, voltage of the feedback voltage input terminal FB decreases to make voltage of the voltage output terminal Vout increase. The working voltage dividing module 2 is increased gradually until the electronic device 4 cannot work, thus determining the maximum allowable working voltage. The meter can be used to measure the current working voltage to determine the allowable maximum of the working voltage. In this embodiment, the zener diode D3 can prevent the amplifier U2 from being burned.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A voltage margin test device comprising:
 a voltage generating module comprising a voltage output terminal to output a working voltage to an electronic device, and a feedback voltage input terminal;
 a voltage dividing module connected to the voltage output and feedback voltage input terminals to transfer the working voltage to the electronic device; and
 a feedback voltage regulating module connected to the voltage dividing module and providing a first regulation voltage to the voltage dividing module for determining an allowable minimum of the working voltage and a second regulation voltage to the voltage dividing module for determining an allowable maximum of the working voltage.

2. The test device of claim 1, wherein a voltage at the voltage output terminal is inversely proportional to a voltage at the feedback voltage input terminal, the feedback voltage regulating module comprises a first voltage output unit to output the first regulation voltage for increasing the voltage at the feedback voltage input terminal and decreasing the working voltage, a second voltage output unit to output the second regulation voltage for decreasing the voltage at the feedback voltage input terminal and increasing the working voltage, and a switch unit to allow the first output unit or the second output unit to be connected to the voltage dividing module.

3. The test device of claim 2, wherein the first voltage output unit comprises a first resistor, a first sliding rheostat, and a first amplifier, a non-inverting terminal of the first amplifier is grounded via the first sliding rheostat, and also connected to a positive power supply via the first resistor, and an output terminal and an inverting terminal of the first amplifier are connected to the switch unit.

4. The test device of claim 3, wherein the first voltage output unit further comprises a first zener diode, a second resistor, and a first diode, a cathode of the first zener diode is connected to the first resistor, and an anode of the zener diode is grounded, the second resistor is connected to the positive power supply via the first resistor, an anode of the first diode is connected to the output terminal of the first amplifier, and a cathode of the first diode is connected to the switch unit.

5. The test device of claim 4, wherein the second voltage output unit comprises a third resistor, a second sliding rheostat, and a second amplifier, a non-inverting terminal of the second amplifier is connected to a negative power supply via the third resistor, and also grounded via the second sliding rheostat, a power terminal of the second amplifier is connected to a positive power supply, a ground terminal of the second amplifier is grounded, and an inverting terminal and an output terminal of the second amplifier are connected to the switch unit.

6. The test device of claim 5, wherein the second voltage output unit further comprises a second zener diode, an anode of the second zener diode is connected to the output terminal of the second amplifier, and a cathode of the second zener diode is connected to the switch unit.

7. The test device of claim 6, wherein the voltage dividing module comprises a fourth resistor and a fifth resistor, a first terminal of the fourth resistor is connected to the voltage output terminal and the electronic device, a second terminal of the fourth resistor is grounded via the fifth resistor, and also connected to the feedback voltage input terminal and the switch unit of the feedback voltage regulating module.

8. The test device of claim 7, wherein the switch unit comprises a single-pole three-throw switch and a third sliding rheostat, a pole terminal of the switch is connected to a node between the fourth and fifth resistors of the voltage dividing module via the third sliding rheostat, a first throw terminal of the switch is connected to the cathode of the first diode, a second throw terminal of the switch is idle, and a third throw terminal of the switch is connected to the cathode of the second zener diode of the second voltage output unit.

9. The test device of claim 8, wherein the switch unit further comprises a capacitor, and the capacitor is connected between the pole terminal of the switch and the ground.

10. The test device of claim 8, wherein the second voltage output unit further comprises a third zener diode, an anode of the third zener diode is connected to the output terminal of the second amplifier, and a cathode of the third zener diode is connected to the switch unit.

* * * * *